(12) United States Patent
Zhang et al.

(10) Patent No.: US 8,125,284 B2
(45) Date of Patent: Feb. 28, 2012

(54) TEMPERATURE COMPENSATION METHOD AND APPARATUS FOR AN OUTPUT FREQUENCY SIGNAL BASED ON SUCCESSIVE APPROXIMATION

(76) Inventors: Mi Zhang, Shanghai (CN); Weixun Cao, Cupertino, CA (US)

( * ) Notice: Subject to any disclaimer, the term of this patent is extended or adjusted under 35 U.S.C. 154(b) by 87 days.

(21) Appl. No.: 12/567,802

(22) Filed: Sep. 28, 2009

(65) Prior Publication Data

US 2010/0079214 A1    Apr. 1, 2010

Related U.S. Application Data

(60) Provisional application No. 61/101,146, filed on Sep. 29, 2008.

(51) Int. Cl.
 *H03L 1/02* (2006.01)
(52) U.S. Cl. .......................................... 331/176; 331/66
(58) Field of Classification Search ............... 331/65, 331/66, 176
See application file for complete search history.

(56) References Cited

U.S. PATENT DOCUMENTS

4,443,116 A * 4/1984 Yoshida et al. ............... 368/202
(Continued)

*Primary Examiner* — Levi Gannon
(74) *Attorney, Agent, or Firm* — Joe Zheng (57) ABSTRACT

Techniques of compensating frequency in an output in reference to a reference frequency signal are disclosed. The reference frequency signal may be from a crystal oscillator or other oscillators. Due to the changes of the temperature, the reference frequency signal drifts. According to one aspect of the techniques, a temperature frequency correction word is generated in accordance with a frequency compensation value in view of a current temperature to generate a substantially temperature compensated frequency output from a reference frequency signal. The frequency control word is produced from a successive approximation circuit configured to produce the temperature frequency correction word in accordance with the frequency compensation value in view of the current temperature. Both the temperature frequency correction word and a frequency control word are data represented in a sequence of bits. As a result, the compensated frequency output can be of high precision.

12 Claims, 7 Drawing Sheets

U.S. PATENT DOCUMENTS 4,949,055 A * 8/1990 Leitl .............................. 331/158
5,172,075 A * 12/1992 Yerbury et al. ................. 331/14
5,477,194 A * 12/1995 Nagakura ....................... 331/10
5,748,047 A * 5/1998 Guthrie et al. ................. 331/19

* cited by examiner

TEMPERATURE COMPENSATION METHOD AND APPARATUS FOR AN OUTPUT FREQUENCY SIGNAL BASED ON SUCCESSIVE APPROXIMATION

This application claims the benefits of U.S. Provisional Application Ser. No. 61/101,146, entitled "Method and apparatus for temperature compensation of a reference frequency signal based on successive approximation", filed on Sep. 29, 2008

BACKGROUND OF THE INVENTION

1. Field of the Invention

The present invention is generally related to electronic circuits, and more particularly related to techniques for compensating the frequency drift of a reference frequency due to the change of temperature.

2. Description of the Related Art

To ensure all electronic parts to work properly or in synchronization, providing an accurate timing clock signal is very important in electronic circuit designs. Usually, such a timing clock signal is produced in a crystal oscillator that is an electronic circuit using the mechanical resonance of a vibrating crystal of piezoelectric material to create an electrical signal with a frequency. This frequency is commonly used to keep track of time (as in quartz wristwatches), to provide a timing clock signal for digital integrated circuits, and to stabilize frequencies for radio transmitters/receivers. One of the factors that causes a timing clock signal different from the design is the temperature that may affect the piezoelectric material and operation of the crystal oscillator. As the temperature changes, the frequency from the crystal oscillator also changes. In reality, electronic devices, such as portable computers, portable phones and electronic meters, may be used in a wide variety of environments in which temperature varies, it is important that these devices operate as designed without failures or malfunctions due to the changes of the temperature.

Many modern communication devices, such as the GPS and GSM systems, require a highly accurate and stable frequency to increase the sensitivity of a transceiver therein and to reduce the acquisition/track time. Unfortunately, the output of a crystal oscillator tends to drift with ages and temperature changes. A simple crystal oscillator (XO) does not provide a means for controlling the crystal's frequency variation as the ambient temperature changes. Due to the stringent requirements, it is not possible to use a cost-effective stand-alone crystal oscillator in a cellular system without some frequency tuning support from the base station.

The high-stability frequency sources in the wireless communication device or mobile handset generally include a digitally controlled crystal oscillator (DCXO) or temperature-compensated crystal oscillator (TCXO). Unfortunately, the DCXO circuit requires large capacitors to perform frequency corrections on the crystal oscillator. Thus, it is extremely expensive to use the DCXO circuit, especially for a deep submicron CMOS process. Moreover, the switching of a large number of capacitors in the DCXO to adjust the crystal oscillator frequency may result in frequency beating effects that exhibit themselves as spurs in the generated frequency output. Furthermore, the DCXO circuit requires a digitally-controlled compensated frequency signal to compensate the frequency drift when temperature changes.

A simple design is to save a plurality of frequency compensation values, which are obtained by testing at corresponding test temperature points with a fixed temperature interval, in a look-up table. When the frequency is required to be compensated at a certain temperature, the frequency compensation value corresponding to the certain temperature is obtained from the look-up table to compensate the frequency drift. At these temperature points, there are obvious frequency jumps which may influence the functionality of the system. One possible solution is to get the proper frequency compensation value by interpolation of two or more adjacent frequency compensation values saved in the look-up table, but this may complicate the hardware design and degrade the compensation precision of the frequency. Another possible solution is to decrease the interval and increase the number of the frequency compensation values saved in the look-up table, but this may increase the memory and increase test temperature points. Thus, it is useful to find an efficient way to generate the frequency compensation value while using minimal hardware cost.

In a conventional temperature-compensated crystal oscillator (TCXO), a thermostat generates a correction voltage to keep the oscillator's frequency constant. Such a voltage-controlled TCXO has a temperature sensor that generates a linear voltage in proportion to the temperature. With a $3^{rd}$-order linear function voltage generator and a voltage controlled crystal oscillator circuit (VCXO), the outputs of the temperature sensor and the $3^{rd}$-order function voltage generator are provided to the VCXO which compensates for the temperature vs. frequency characteristics of the crystal being used.

However, such a voltage-controlled TCXO first requires a high quality crystal to meet the $3^{rd}$-order linear compensation requirement, which is expensive, particularly, when the size of the crystal is reduced. It is also difficult to achieve high frequency stability and accuracy, as the maximal output frequency of a crystal oscillator is limited. Further, it is difficult to control small frequency changes (e.g. less than 1.0 Hz) in a voltage-controlled TCXO as it is difficult to generate accurately an analog voltage in the range of micro volts.

Therefore, there is a need for a low-cost, low-noise, low-memory and high accurate solution for generating a frequency in a wide frequency range and to be temperature compensated over a wide temperature range.

SUMMARY OF THE INVENTION

This section is for the purpose of summarizing some aspects of the present invention and to briefly introduce some preferred embodiments. Simplifications or omissions in this section as well as in the abstract may be made to avoid obscuring the purpose of this section and the abstract. Such simplifications or omissions are not intended to limit the scope of the present invention.

The present invention pertains to techniques of compensating frequency in an output in reference to a reference frequency signal, where the reference frequency signal may be from a crystal oscillator or other oscillators. Due to the changes of the temperature, the reference frequency signal drifts. Techniques are so designed to compensate for possible drifts in the reference frequency signal and produce a steady frequency signal. According to one aspect of the present invention, a temperature frequency correction word is generated in accordance with a frequency compensation value in view of a current temperature to generate a substantially temperature compensated frequency output from a reference frequency signal. The frequency control word is produced from a successive approximation circuit configured to produce the temperature frequency correction word in accordance with the frequency compensation value in view of the current temperature. Both the temperature frequency correction word and a frequency control word are data represented in a sequence of bits. As a result, the compensated frequency output can be of high precision.

Depending on implementation, the present invention may be implemented as a method, a system and an architecture of integrated circuit. According to one embodiment, the present invention is an apparatus for compensating a frequency drift of a reference frequency signal, the apparatus comprises: a successive approximation circuit configured to produce a temperature frequency correction word in accordance with a frequency compensation value in view of a current temperature; and a frequency locked circuit, receiving the reference frequency signal from an external oscillating source and a corrected frequency control word, configured to generate a substantially temperature compensated frequency output in reference to the temperature frequency correction word from the successive approximation circuit, wherein the temperature frequency correction word and the corrected frequency control word are data represented in a sequence of bits.

According to another embodiment, the present invention is a method for compensating a frequency drift of a reference frequency signal, the method comprises: determining a temperature frequency correction word in accordance with a frequency compensation value in view of a current temperature; and generating a temperature compensated frequency output from the reference frequency signal and a corrected frequency control word in view of the temperature frequency correction word, wherein the temperature frequency correction word and the corrected frequency control word are data represented in a sequence of bits.

According to another embodiment, the present invention is a method for compensating a frequency drift of a reference frequency signal, the method comprises: determining a plurality of predefined temperatures with a predefined temperature interval therebetween; determining temperature frequency correction words respectively for predefined temperatures; encoding the temperature frequency correction words with an initial temperature out of the predefined temperatures; storing the encoded temperature frequency correction words in a memory of an integrated circuit; decoding and re-sampling the temperature frequency correction words in the integrated circuit in accordance with a step size; and calculating a value of each sign bit in a successive sign bit sequence according to the temperature frequency correction words and a current temperature.

Other objects, features, benefits and advantages, together with the foregoing, are attained in the exercise of the invention in the following description and resulting in the embodiment illustrated in the accompanying drawings.

BRIEF DESCRIPTION OF THE DRAWINGS

These and other features, aspects, and advantages of the present invention will be better understood with regard to the following description, appended claims, and accompanying drawings where:

DETAILED DESCRIPTION OF THE PREFERRED EMBODIMENTS

The detailed description of the present invention is presented largely in terms of procedures, steps, logic blocks, processing, or other symbolic representations that directly or indirectly resemble the operations of devices or systems contemplated in the present invention. These descriptions and representations are typically used by those skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

Figure 1:
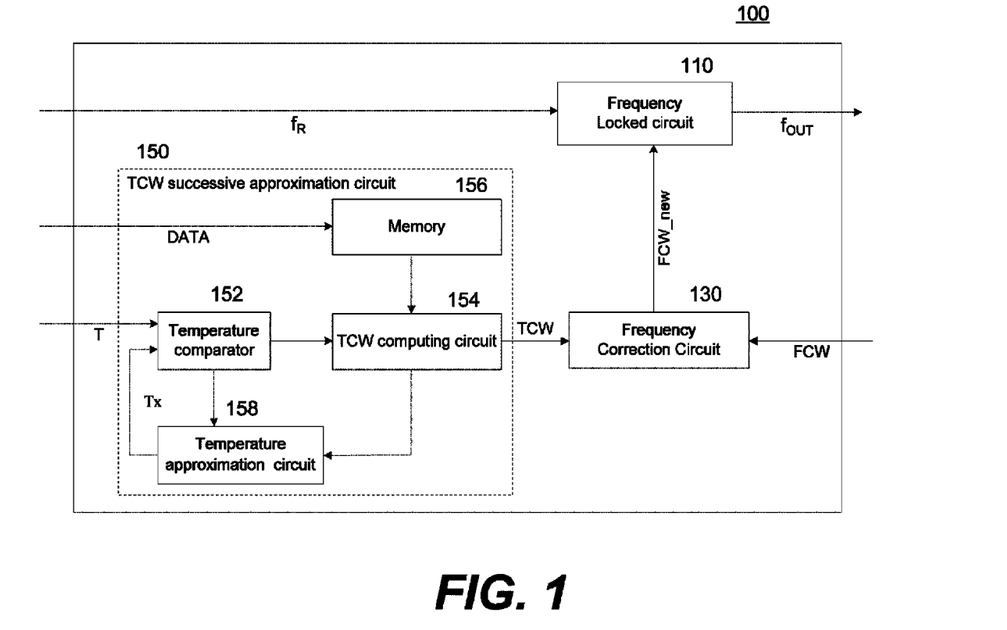
FIG. 1 is a block diagram of an exemplary temperature compensated frequency synthesizer in accordance with one embodiment of the present invention.

Referring now to the drawings, in which like numerals refer to like parts throughout the several views. FIG. 1 shows an exemplary temperature compensated frequency synthesizer 100 providing a substantially temperature compensated frequency output, $f_{OUT}$, in accordance with the present invention. A reference frequency signal, $f_R$, may be provided by a crystal oscillator or other oscillator. This reference frequency signal $f_R$ is used as a reference clock for a frequency locked circuit 110 that generates the required output frequency, $f_{OUT}$, by using a corrected frequency control word, FCW_new, where $$f_{OUT} = K \times \text{FCW\_new} \times f_R.$$

where K is a scaling coefficient. Depending on the scaling coefficient K and the corrected frequency control word, FCW_new, a desired timing clock signal can be obtained. One of the features, objectives and advantages in the present invention is that the frequency drift of the reference clock $f_R$ can be compensated by the corrected frequency control word, FCW_new, while K is used to scale up or down the corrected frequency.

A frequency correction circuit 130 is provided to generate the corrected frequency control word, FCW_new, generally expressed in bits (e.g., 32 bits), by compensating a frequency control word, FCW, which may be provided externally, with a temperature frequency correction word, TCW, where:

$$\text{FCW\_new} = \text{FCW} + \text{TCW}.$$

According to one embodiment, a TCW successive approximation circuit 150 is provided to automatically track and lock the temperature frequency correction word TCW of any predetermined temperature T from an initial temperature frequency correction word TCW(T0) of the temperature T0 by using a successive approximation method. In other words, the TCW successive approximation circuit 150 successively computes the temperature frequency correction word TCW of an internal temperature Tx, which is increased or decreased by a temperature interval S every time, from the initial temperature frequency correction word TCW(T0) until the internal temperature Tx is caught into a locked range of the predetermined temperature T. Thus, the TCW successive approximation circuit 150 outputs the temperature frequency correction word, TCW of the predetermined temperature T.

As used herein, a word does not necessarily mean 8 bits. It may mean data represented in a sequence of bits (e.g., 8-bit, 16-bit or 32-bit). The predetermined temperature T may be provided by a digital temperature sensor (not shown) which is used to sense an ambient temperature of the reference frequency source.

For example, it is desired to generate a desired output frequency of 890 MHz, FCW may be a sequence of bits representing the desired frequency value, TCW may be a sequence of bits representing the temperature frequency compensation value. As a result, the frequency of 890 MHz outputted from the frequency locked circuit 110 may not change along with temperature drift any more. Namely, the output frequency of 890 MHz is compensated by the corrected frequency control word, FCW_new. For another example, it is desired to generate a frequency modulated (FM) signal within a frequency range of 890 MHz~910 MHz, FCW is a sequence of bits representing the frequencies in the range, TCW is a sequence of bits representing the frequency compensation value. As a result, the exemplary temperature compensated frequency synthesizer 100 of FIG. 1 functions as a FM generator with temperature compensated frequencies.

Figure 4:
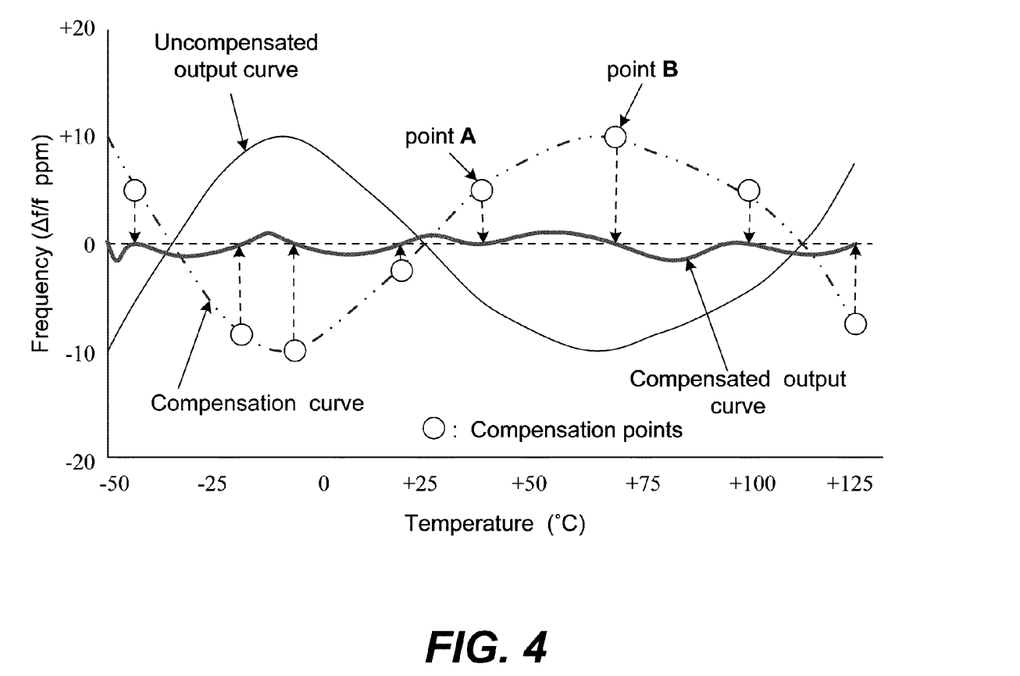
FIG. 4 is a graph of temperature frequency characteristic curves for the reference frequency signal, wherein an uncompensated output curve, a compensation curve and a compensated output curve are shown.

FIG. 4 shows a graph of frequency versus temperature characteristic curves for a reference frequency signal $f_R$ having a frequency stability of about ±10 ppm over a temperature range from −50° C. to 125° C. An uncompensated output curve, a compensation curve and a compensated output curve are all shown in FIG. 4. The compensation curve includes a plurality of discrete compensation points each corresponding to a compensated temperature point and a temperature frequency correction value. It shows that the frequency drift of the compensated output is greatly reduced in comparison with the uncompensated output.

In the prior art, the temperature frequency correction/compensation values of each compensated temperature point shown in FIG. 4 are stored in a look-up table. The temperature frequency correction/compensation word at each compensated temperature point is accurately measured during manufacturing or testing by comparing the output frequency $f_{OUT}$ and the actually expected frequency. The temperature frequency correction values between two compensated points, such as point A and B shown in FIG. 4, are estimated by using a linear interpolation logic. The more the compensated points stored in the look-up table, the more accurate the interpolated frequency correcting word will be. However, the hardware cost of the look-up table and the testing cost of the compensated points increases while the number of compensated points stored in the look-up table increases.

Referring back to FIG. 1, the TCW successive approximation circuit 150 comprises a temperature comparator 152, a TCW computing circuit 154, a memory 156 and a temperature approximation circuit 158. The memory 156 is provided to store the temperature frequency correction word TCW(T0) of the initial temperature T0, a fixed step size value generally expressed in bits (e.g., 16 bits) and a successive sign bit sequence. The successive sign bit sequence is a sequence consisting of a sign bit of each fixed step size value. The more the number of bits of the successive sign bit sequence has, the smaller a temperature interval S between two adjacent internal temperatures is. In one embodiment, when the sign bit is "1", it represents a fixed step size value being positive, and when the sign bit is "0", it represents the fixed step size value being negative. The initial temperature frequency correction word TCW(T0), the fixed step size value and the successive sign bit sequence are programmed into the memory 156 by using the input signal, DATA.

The temperature comparator 152 is provided for comparing the predetermined temperature T with an internal temperature Tx to output a comparative result, wherein the initial value of the internal temperature Tx is T0. The comparative result comprises three different situations: the internal temperature Tx being inside a locked range of the predetermined temperature T; the internal temperature Tx being outside the locked range of the predetermined temperature T and Tx<T; the internal temperature Tx being outside the locked range of the predetermined temperature T and Tx>T.

When the comparative result is Tx being outside the locked range of the predetermined temperature T and Tx<T, the TCW computing circuit 154 is configured for reading one sign bit SB(Tx) of the internal temperature Tx from the successive sign bit sequence, assigning the read sign bit SB(Tx) to the fixed step size value to get an actual step size of the internal temperature Tx, and computing the temperature frequency correction word TCW(Tx+S) of the internal temperature Tx+S according to the temperature frequency correction word TCW(Tx) and the actual step size of the internal temperature Tx, wherein the initial value of the temperature frequency correction word TCW(Tx) is TCW(T0) pre-stored in the memory 156. Subsequently, the temperature approximation circuit 158 is provided for increasing the internal temperature Tx by the temperature interval S and outputting the new internal temperature Tx to the temperature comparator 152. Thus, the internal temperature Tx successively approximate to the predetermined temperature T.

When the comparative result is Tx being outside the locked range of T and Tx>T, the TCW computing circuit 154 is configured for reading one sign bit SB(Tx−S) of the internal temperature Tx−S from the successive sign bit sequence, assigning the read sign bit SB(Tx−S) to the fixed step size value to get the actual step size of the internal temperature Tx−S, and computing the temperature frequency correction word TCW(Tx−S) of the internal temperature Tx−S according to the temperature frequency correction word TCW(Tx) of the internal temperature Tx and the actual step size of the internal temperature Tx−S, wherein the initial value of the temperature frequency correction word TCW(Tx) is TCW(T0) pre-stored in the memory 156. Subsequently, the temperature approximation circuit 158 is provided for decreasing the internal temperature Tx by the temperature interval S and outputting the new internal temperature Tx to the temperature comparator 152. Thus, the internal temperature Tx successively approximate to the predetermined temperature T. Simultaneously, the temperature frequency correction word TCW(Tx) also approximate to the desired temperature frequency correction word TCW(T) of the predetermined temperature T.

When the comparative result is Tx being inside the locked range of the predetermined temperature T, the TCW computing circuit 154 computes the desired temperature frequency correction word TCW(T) of the predetermined temperature T according to the locked temperature frequency correction word TCW(Tx) of the internal temperature Tx.

For each compensated temperature point, it only requires to store 1-bit data as the sign bit of the fixed step size value. Thus, more compensated temperature points with small temperature interval can be re-sampled for temperature frequency compensation, and the high accurate compensation and the minimum memory capacity can be achieved in one embodiment of the present invention. Furthermore, a fully digital successive approximation solution is provided in the present invention to automatically track and lock the temperature frequency correction word TCW of any predetermined temperature T, thereby minimizing the memory capacity and increasing the compensation precision.

Figure 2:
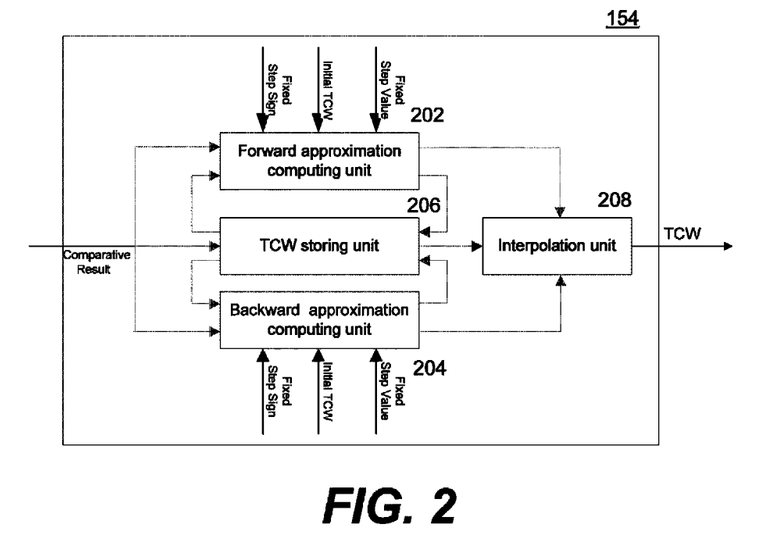
FIG. 2 is a block diagram of a TCW computing circuit shown in FIG. 1.

FIG. 2 is a block diagram showing a TCW computing circuit 154 in accordance with one embodiment of the present invention. The TCW computing circuit 154 comprises a forward approximation computing unit 202 for computing the temperature frequency correction word TCW(Tx+S) of the internal temperature Tx+S when Tx being outside the locked range of T and Tx<T, a backward approximation computing unit 204 for computing the temperature frequency correction word TCW(Tx−S) of the internal temperature Tx−S when Tx being outside the locked range of T and Tx>T, a TCW storing unit 206 for storing the temporary temperature frequency correction word, and an interpolation unit 208 for computing the temperature frequency correction TCW(T) of the predetermined temperature T with preferable interpolation based on the locked temperature frequency correction TCW(Tx) of the internal temperature Tx.

Figure 3:
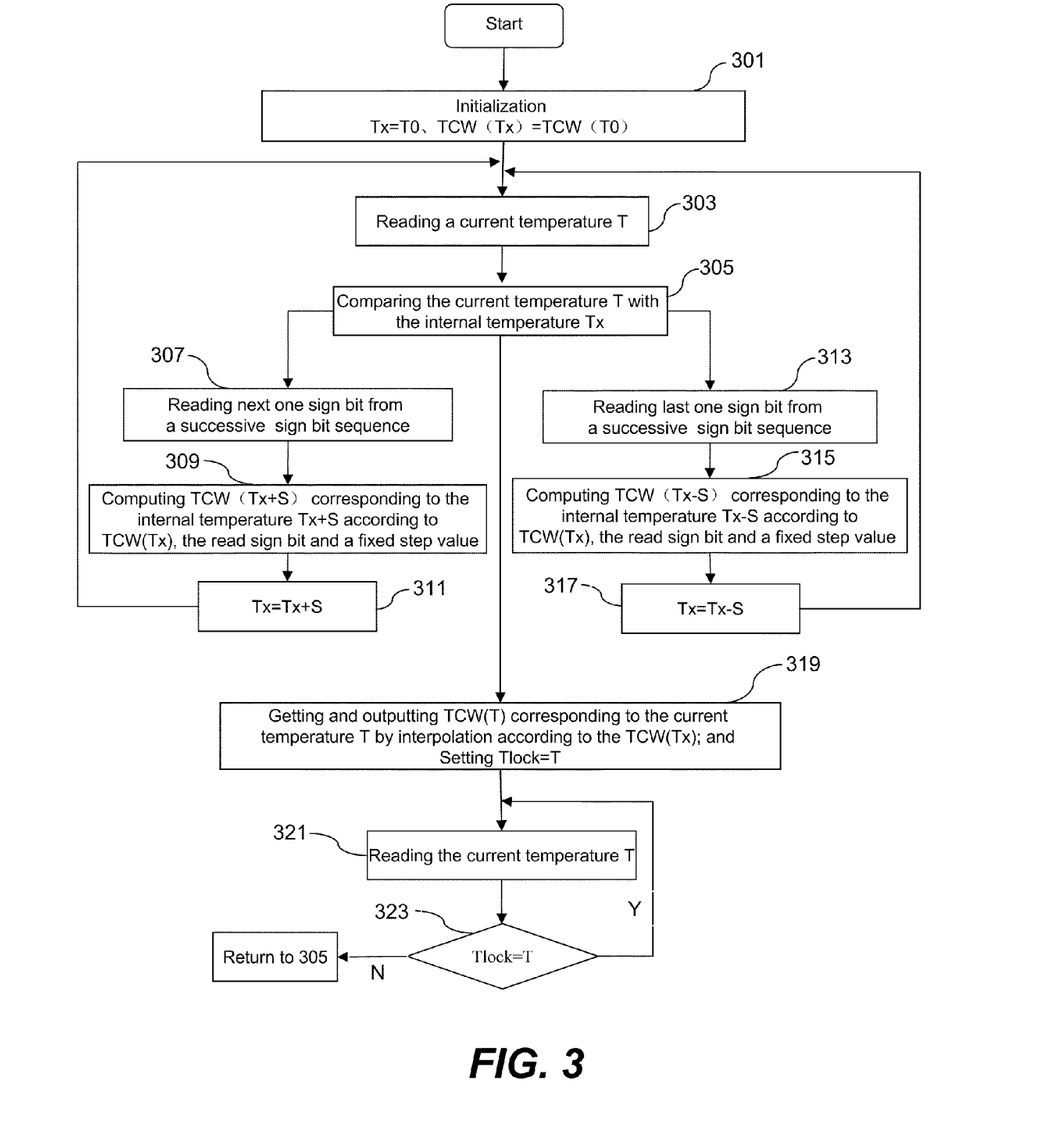
FIG. 3 is a flowchart of a method for successively tracking and locking a temperature frequency correction word TCW of a current temperature T in accordance with one embodiment of the present invention.

FIG. 3 is a flowchart of successively tracking and locking the temperature frequency correction word TCW of the predetermined temperature T in accordance with one embodiment of the present invention. The successive approximation method comprises following operations.

At 301, some parameters are initialized: Tx=T0, TCW(Tx)=TCW(T0), wherein Tx denotes the current internal temperature, TCW(Tx) denotes the temperature frequency correction word TCW of the internal temperature Tx, T0 is the initial temperature, TCW(T0) is the temperature frequency correction word of the initial temperature T0 pre-stored in the memory 156 shown in FIG. 1.

At 303, the current temperature T is read from external. The current temperature T may be provided from the digital temperature sensor and is also referred as the predetermined temperature or object temperature in the present invention.

At 305, the current temperature T is compared with the internal temperature Tx, if Tx is outside the locked range of T and Tx<T, the process is taken to 307, if Tx is outside the locked range of T and Tx>T, the process is taken to 313, if Tx is inside the locked range of T, the process is taken to 319.

At 307, one sign bit SB(Tx) of the internal temperature Tx is read out from the successive sign bit sequence pre-stored in the memory 156 and assigned to the fixed step size value pre-stored in the memory 156 to get the actual step size of the internal temperature Tx, wherein SB(Tx) is the sign bit of the internal temperature Tx in the successive sign bit sequence.

At 309, the temperature frequency correction word TCW(Tx+S) of the internal temperature Tx+S is computed according to the temperature frequency correction word TCW(Tx) and the actual step size of the internal temperature Tx, wherein S is the temperature interval mentioned above.

At 311, Tx=Tx+S and the process is returned to 303. For eliminating the influence because of the changes of the current temperature T, the process is preferably returned to 303, but not 305.

At 313, one sign bit SB(Tx−S) of the internal temperature Tx−S is read out from the successive sign bit sequence pre-stored in the memory 156 and assigned to the fixed step size value pre-stored in the memory 156 to get the actual step size of the internal temperature Tx−S.

At 315, the temperature frequency correction word TCW(Tx−S) of the internal temperature Tx−S is computed depending on the temperature frequency correction word TCW(Tx) and the actual step size of the internal temperature Tx−S.

At 317, Tx=Tx−S and the process is returned to 303. For eliminating the influence because of the changes of the current temperature T, the process is preferably returned to 303, but not 305.

At 319, the desired temperature frequency correction word TCW(T) of the current temperature T is computed with preferable interpolation according to the temperature frequency correction word TCW(Tx). At the same time, T is recoded as Tlock.

It should be explained that if the precision of the current temperature T is less than the temperature interval S, e.g. S=0.2° C. and the precision of T is 0.1° C., the interpolation is necessary for getting the desired temperature frequency correction word TCW(T). Otherwise, the interpolation may not be necessary. Furthermore, a variety of conventional interpolations such as linear interpolation, non-linear interpolation or parabolic interpolation etc. may be used for getting the desired temperature frequency correction word TCW(T) according to the locked temperature frequency correction word TCW(Tx). In some embodiment, other adjacent temporary temperature frequency correction word such as TCW(Tx−S), TCW(Tx+S) may also be required for interpolation.

At 321, the current temperature T is read. At 323, whether T is equal to Tlock is determined, if yes, the process is returned to 321, otherwise, the process is returned to 305 to repeat the temperature locking operation.

As described above, the basic idea of the successive approximation solution is to successively adjust the internal temperature Tx to be approximate the current temperature T by the temperature interval S, and compute the temperature frequency correction word TCW(Tx) of the internal temperature Tx simultaneously until the internal temperature Tx is locked into the predetermined range of the current temperature T, thereby the locked temperature frequency correction word TCW(Tx) can be calculated. Subsequently, the desired temperature frequency correction word TCW(T) of the current temperature T can be computed with interpolation according to the locked temperature frequency correction word TCW(Tx). The current temperature T is detected all the time, when detecting that the current temperature T is unlocked, the flow shown in FIG. 3 begins new temperature tracking and locking operations again.

In a first preferred embodiment, the memory 156 shown in FIG. 1 further stores a difference TCWd(T0) of the temperature frequency correction word TCW(T0) of the initial temperature T0 besides TCW(T0), the fixed step size value and the successive sign bit sequence. The difference of the temperature frequency correction word is the difference value between the temperature frequency correction words of two adjacent temperature points. The fixed step size value is the absolute value of the difference between the differences of the temperature frequency correction words of two adjacent temperature points. So, the fixed step size value can be also referred as the fixed difference step size value and denoted as TCWds. The initial temperature T0 may be the minimum value of the temperature covering range (such as from −30° C. to 50° C.). The number of bits of the successive sign bit sequence is relative to the temperature interval S and the temperature covering range. For an example, provided that the temperature covering range is from −30° C. to 50° C., and the temperature interval S is 0.2° C., the number of bits of the successive sign bit sequence will be (50−(−30))/0.2− 1=400−1 (the sign bit of the maximum temperature 50° C. is not defined and but also not used). It should be noted that TCW(T0), TCWd(T0), TCWds and the successive sign bit sequence are programmed into the memory 156 by using the input line, DATA shown in FIG. 1.

Figure 5:
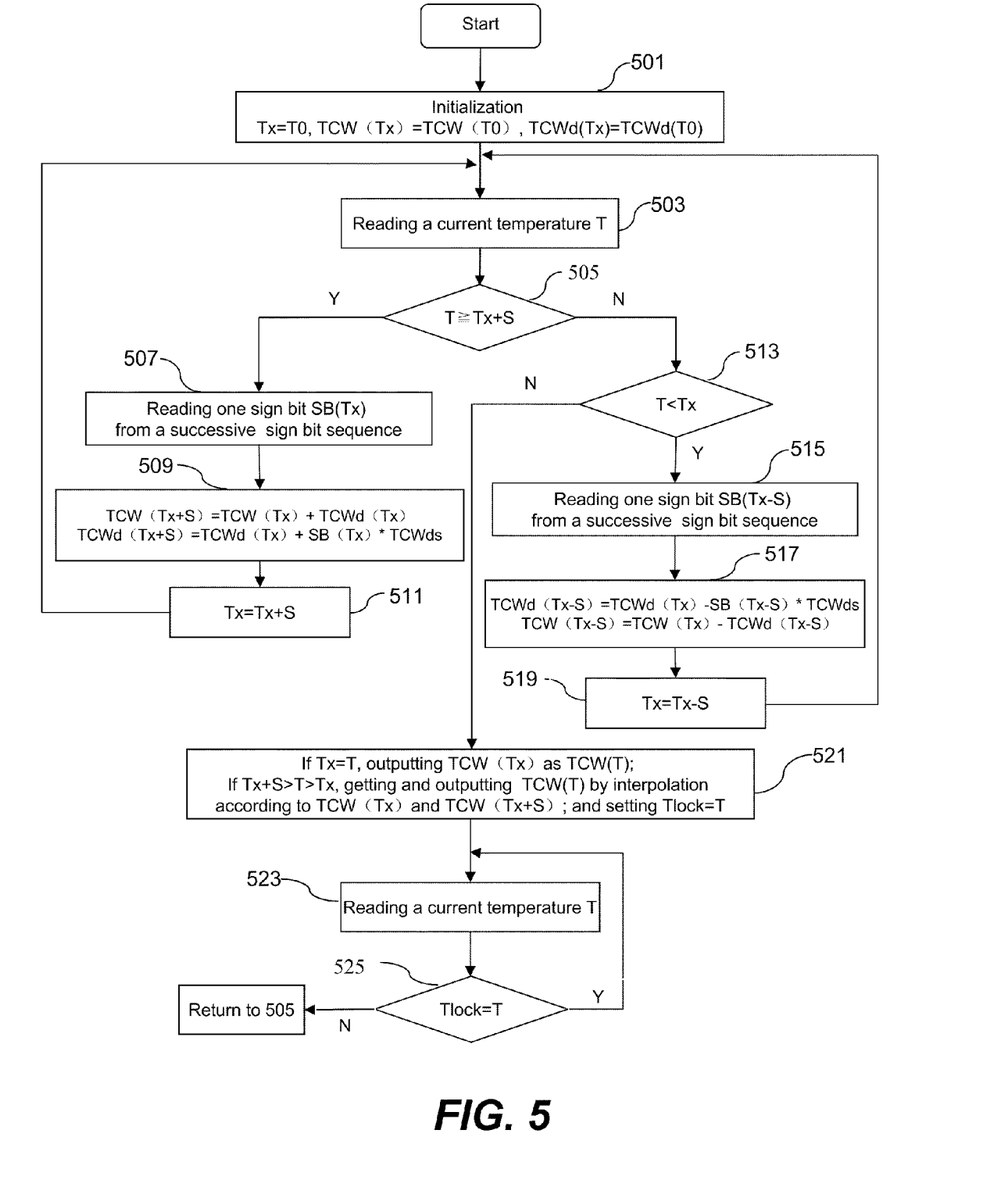
FIG. 5 is a flowchart of a method for successively tracking and locking a temperature frequency correction word TCW of a current temperature T in accordance with another embodiment of the present invention.

FIG. 5 is a flowchart of successively tracking and locking the temperature frequency correction word TCW(T) of the current temperature T in the first preferred embodiment. The successive approximation technique comprises following operations.

At 501, some parameters are initialized: Tx=T0, TCW(Tx) =TCW (T0), TCWd(Tx)=TCWd(T0). At 503, the current temperature T is read from external. At 505, whether the current temperature T is larger than or equal to the internal temperature Tx+S is determined, if yes, the process is taken to 507, otherwise, the process is taken to 513.

At 507, one sign bit SB(Tx) of the internal temperature Tx is read out from the successive sign bit sequence and assigned to the fixed difference step size value TCWds to get the actual difference step size of the internal temperature Tx.

At 509, the temperature frequency correction word TCW (Tx+S) and the difference TCWd(Tx+S) of the internal temperature Tx+S are computed according to the temperature frequency correction word TCW(Tx), the difference TCWd (Tx) and the actual step size of the current internal temperature Tx, wherein:

$$TCW(Tx+S)=TCW(Tx)+TCWd(Tx);$$

$$TCWd(Tx+S)=TCWd(Tx)+SB(Tx)*TCWds.$$

At 511, Tx=Tx+S and the process is returned to 503. At 513, whether the current temperature T is less than the internal temperature Tx is determined, if yes, the process is taken to 515, otherwise, the process is taken to 521.

At 515, one sign bit SB(Tx−S) of the internal temperature Tx−S is read out from the successive sign bit sequence and assigned to the fixed difference step size value TCWds to get the actual difference step size of the internal temperature Tx−S.

At 517, the temperature frequency correction word TCWd (Tx−S) and difference the TCW(Tx−S) of the internal temperature Tx−S are computed according to the temperature frequency correction word TCW(Tx), the difference TCWd (Tx) and the actual step size of the current internal temperature Tx−S, wherein:

$$TCWd(Tx-S)=TCWd(Tx)-SB(Tx-S)*TCWds;$$

$$TCW(Tx-S)=TCW(Tx)-TCWd(Tx-S).$$

At 519, Tx=Tx−S and the process is returned to 503. At 521, if Tx=T, the temperature frequency correction word TCW(Tx) is given as the temperature frequency correction word TCW(T) of the current temperature T; If Tx+S>T>Tx, the temperature frequency correction word TCW(T) of the current temperature T is computed with preferable interpolation based on the temperature frequency correction word TCW(Tx). At the same time, the current temperature T is recorded as Tlock. In this embodiment, the locked range of the current temperature is Tx+S>T≧Tx.

At 523, the current temperature T is read. At 525, whether T is equal to Tlock is determined, if yes, the process is returned to 523, otherwise, the process is returned to 505 to repeat the temperature locking operation.

For an example, provided that the initial temperature T0 is the minimum temperature −30° C. of the temperature covering range, once the temperature compensated frequency synthesizer 100 shown as FIG. 1 is activated, the digital temperature sensor provides the current temperature T such as 20° C. by sensing ambient temperature. Thus, the process flow begin to continuously repeat operations of 503-511 so that the internal temperature Tx is quickly approximate to 20° C. from −30° C. Finally, the process flow enters the operation of 523, where the internal temperature Tx is caught in the locked range of 20° C. (e.g. from 20° C. to 20.2° C.). If the ambient temperature of the temperature compensated frequency synthesizer is suddenly changed, the process flow will enter the tracking and locking operations again immediately.

Figure 6:
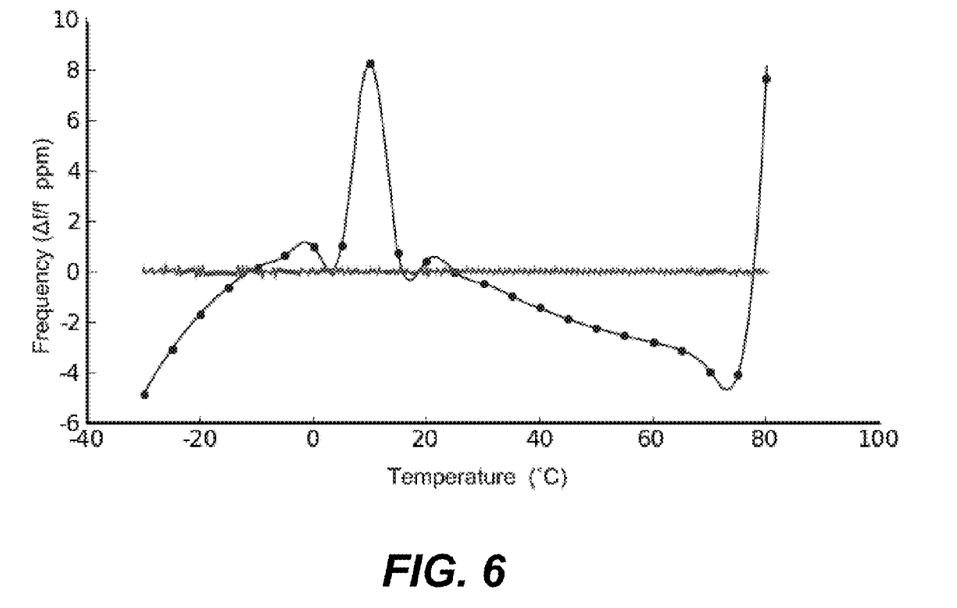
FIG. 6 is a graph of a temperature frequency characteristic curve of the reference frequency signal with obvious frequency jumps in certain temperature ranges.

FIG. 6 is a graph of a temperature frequency characteristic curve of the reference frequency signal with obvious frequency changes in certain temperature ranges. Because there are enough compensated temperature points to be used for temperature frequency compensation in the present invention, the temperature compensation solution of the present invention can follow the temperature frequency characteristic curve of the reference frequency shown in FIG. 6. Thereby, even for the reference frequency signal with obvious frequency changes as shown as FIG. 6, an accurate compensation result of the present invention can be achieved.

Figure 7:
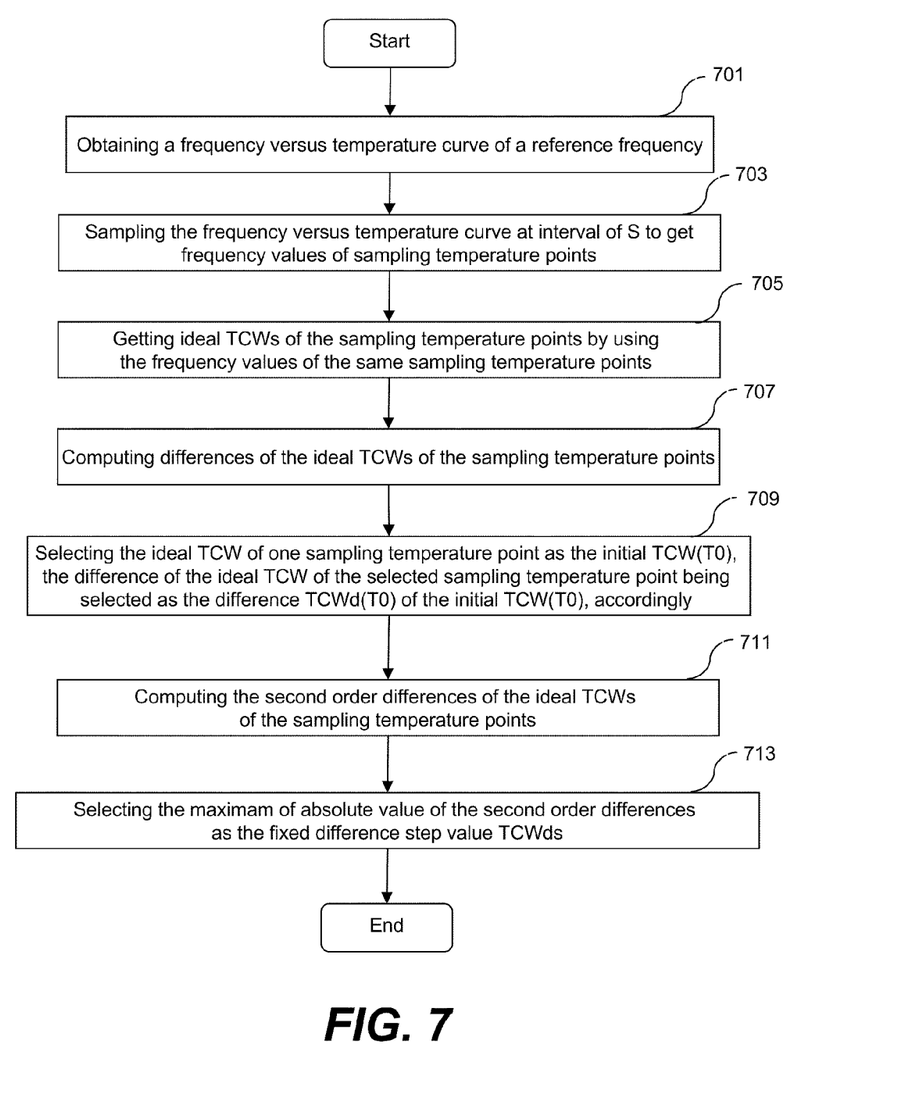
FIG. 7 is a flowchart of determining an initial temperature frequency correction word TCW(T0), a difference TCWd (T0) of the initial temperature frequency correction word TCW(T0) and a fixed difference step TCWds in accordance with the another embodiment of the present invention.
Figure 8:
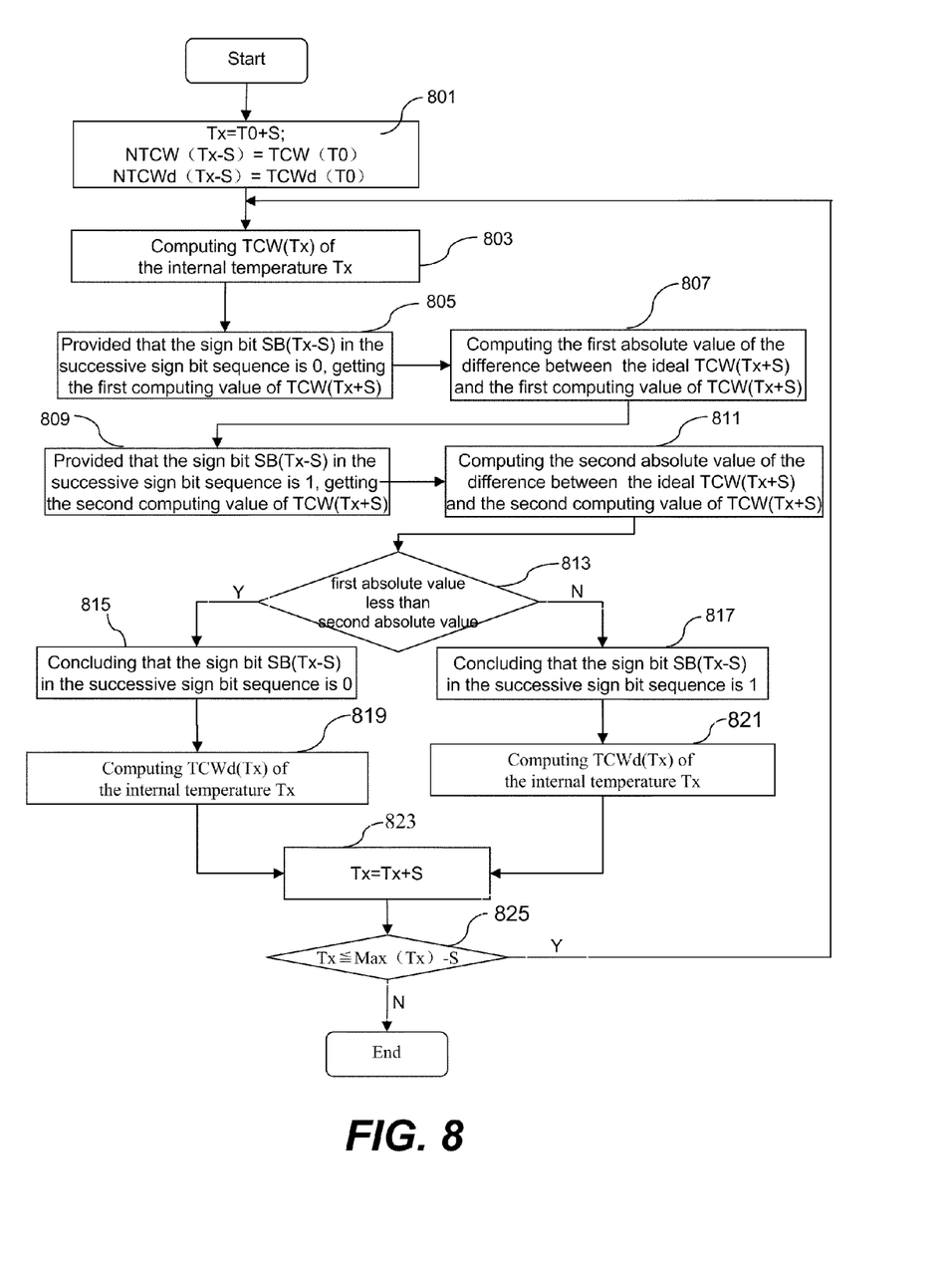
FIG. 8 is a flowchart of determining value of each sign bit in a successive sign bit sequence in accordance with the another embodiment of the present invention.

How to determine TCW(T0), TCWd(T0), TCWds and the successive sign bit sequence is described in detail hereafter. FIG. 7 is a flowchart of determining TCW(T0), TCWd(T0) TCWds in accordance with the first preferred embodiment of the present invention. FIG. 8 is a flowchart of determining the value of each sign bit in the successive sign bit sequence in accordance with the first preferred embodiment of the present invention.

Referring to FIG. 7, the method for determining TCW(T0), TCWd(T0), TCWds comprises the following operations. At 701, the temperature versus frequency curve of the reference frequency signal $f_R$ is obtained. The curve can be obtained by a variety of conventional ways, which must keep the difference between the obtained curve and the actual curve as small as possible and keep the obtained curve smooth simultaneously. In one embodiment, when there is no obvious frequency jumps, Bechamann curve generator can be used to generate the accurate temperature versus frequency curve by using only several temperature test points.

At 703, the frequency versus temperature curve is sampled at the temperature interval S to get frequency values of sampling temperature points. The sampling temperature interval S directly corresponds to the temperature interval S between the two adjacent compensated temperature points mentioned above. The sampling temperature points directly correspond to the compensated temperature point mentioned above accordingly. In one embodiment, the sampling temperature interval S may change according to the different temperature ranges. E.g. for the temperature ranges of 0° C.-20° C. shown in FIG. 6, the sampling temperature interval S may be 0.2° C.; for the other temperature ranges shown in FIG. 6, the sampling temperature interval S may be 0.25° C.

In the prior art, the temperature frequency correction word TCW of each compensated temperature point requires to be accurately measured during manufacturing or testing. Thus, the testing cost for each compensated temperature point is very high so that the number of the compensated temperature points is very limited. In the present invention, the compensated temperature points are obtained by sampling the temperature frequency curve, whereby the number of the compensated temperature points can be easily defined according to the required temperature-frequency compensation accuracy.

At 705, the ideal temperature frequency correction words $TCW_{ideal}(Tx)$ of the sampling temperature points Tx is computed based on the frequency values of the sampling temperature points Tx according to a function relation between the frequency values and the temperature frequency correction words TCW of the sampling temperature points Tx. Herein, Tx is the discrete sampling temperature points with the temperature interval S from the minimum (Tx) to maximum (Tx). The ideal temperature frequency correction words $TCW_{ideal}(Tx)$ of the sampling temperature points Tx is recorded to determine the value of each sign bit of the successive sign bit sequence.

At 707, the differences $TCWd_{ideal}(Tx)$ of the ideal temperature frequency correction words $TCW_{ideal}(Tx)$ of the sampling temperature points Tx are computed, wherein $$TCWd_{ideal}(Tx)=TCW_{ideal}(Tx+S)-TCW_{ideal}(Tx),$$

Herein, Tx is from the minimum (Tx) to maximum (Tx−S).

At 709, one sampling temperature point such as the minimum, maximum or intermediate value of Tx is selected as the initial temperature T0, the ideal temperature frequency correction word of the selected sampling temperature point is selected as TCW(T0), and the difference of the ideal temperature frequency correction word of the selected sampling temperature point is selected as TCWd(T0), accordingly.

At 711, the second order differences $TCWdd_{ideal}(Tx)$ of the ideal temperature frequency correction words $TCW_{ideal}(Tx)$ of the sampling temperature points Tx are computed, wherein $$TCWdd_{ideal}(Tx)=TCWd_{ideal}(Tx+S)-TCWd_{ideal}(Tx)$$

Herein, Tx is from the minimum (Tx) to maximum (Tx−2S).

At 713, the maximal absolute value of the second order differences $TCWdd_{ideal}(Tx)$ is selected as the fixed difference step value TCWds. Thus, the fitting curve formed during temperature tracking and locking operations in FIG. 5 can perfectly follow the ideal curve obtained at 701. In other embodiment, the absolute value of the other second order differences $TCWdd_{ideal}(Tx)$ may also be selected as the fixed difference step value TCWds.

It can be seen that the data TCW(T0), TCWd(T0) and TCWds are measured through operations of 701-713 and will be used to determine the value of each sign bit of the successive sign bit sequence shown in FIG. 8.

Referring to FIG. 8, the method for determining the value of each sign bit of a successive sign bit sequence comprises the following operations. At 801, some parameters are initialized: Tx=T0+S; NTCW(Tx−S)=TCW(T0); NTCWd(Tx−S)=TCWd (T0, where Tx is the current compensated temperature points herein, NTCW(Tx−S) is the temperature frequency correction word of Tx−S, NTCWd(Tx−S) is the difference of the temperature frequency correction word NTCW (Tx−S) of Tx−S. It should be noted that the ideal temperature frequency correction words $TCW_{ideal}(Tx)$ is different from the temperature frequency correction word NTCW(Tx). In this embodiment, the minimum value of the temperature range is selected as the initial temperature T0. In other embodiment, if the maximum value of the temperature range is selected as the initial temperature T0, the initialization operation may be modified as: Tx=T0−S; NTCW (Tx+S)=TCW(T0); NTCWd(Tx+S)=TCWd(T0), the following operations may be modified correspondingly which is omitted here for clarity.

At 803, the temperature frequency correction word NTCW (Tx) of the compensated temperature point Tx is computed, wherein:

$$NTCW(Tx)=NTCW(Tx-S)+NTCWd(Tx-S)$$

At 805, provided that the sign bit SB(Tx−S) of the compensated temperature point Tx−S is negative such as "0", the first computing value NTCW0 (Tx+S) can be given as:

$$NTCW0(Tx+S)=NTCW(Tx)+NTCWd(Tx)=NTCW(Tx-S)+NTCWd(Tx-S)+SB(Tx-S)*TCWds=NTCW(Tx-S)+2*NTCWd(Tx-S)-TCWds.$$

At 807, the first absolute value DNTCW0(Tx+S) of the difference between the first computing value NTCW0(Tx+S) and the ideal temperature frequency correction words $TCW_{ideal}(Tx+S)$ is computed, wherein:

$$DNTCW0(Tx+S)=Abs(TCW_{ideal}(Tx+S)-NTCW0(Tx+S)).$$

At 809, provided that the sign bit SB(Tx−S) of the compensated temperature point Tx−S is positive such as "1", the second computing value NTCW1(Tx+S) is computed, wherein:

$$NTCW1(Tx+S) = NTCW(Tx-S) + 2*NTCWd(Tx-S) + SB(Tx-S)*TCWds$$
$$= NTCW(Tx-S) + 2*NTCWd(Tx-S) + TCWds.$$

At 811, the second absolute value DNTCW1(Tx+S) of the difference between the second computing value NTCW1(Tx+S) and the ideal temperature frequency correction words $TCW_{ideal}(Tx+S)$ is computed, wherein:

$$DNTCW1(Tx+S)=Abs(TCW_{ideal}(Tx+S)-NTCW1(Tx+S)).$$

At 813, whether the first absolute value DNTCW0(Tx+S) is less than the second absolute value DNTCW1(Tx+S) is determined, if yes, the process is taken to 815, otherwise, the process is taken to 817.

At 815, the sign bit SB(Tx−S) of the compensated temperature point Tx−S in the successive sign bit sequence is determined as negative such as "0", then the process enters 819.

At 817, the sign bit SB(Tx−S) of the compensated temperature point Tx−S in the successive sign bit sequence is determined as positive such as "1", then the process enters 821.

At 819, the difference NTCWd(Tx) of the temperature frequency correction word NTCW(Tx) is computed, wherein:

$$NTCWd(Tx)=NTCWd(Tx-S)-TCWds.$$

At 821, the difference NTCWd(Tx) of the temperature frequency correction word NTCW(Tx) is computed, wherein:

$$NTCWd(Tx)=NTCWd(Tx-S)+TCWds.$$

At 823, Tx=Tx+S and the process is taken to 825, where whether Tx is less than or equal to MAX(Tx)−S, if no, the process exits; otherwise, the process is returned to 803.

It can be seen that the value of each sign bit can be determined by operations of 801-825. Finally, the determined data TCW(T0), TCWd(T0), TCWds and the successive sign bit sequence are stored in the memory 156 shown in FIG. 1.

In a second preferred embodiment, besides TCW(T0), the fixed step size value and the successive sign bit sequence, the memory further stores a difference TCWd(T0) of the temperature frequency correction word TCW(T0) at the initial temperature T0, a second order difference TCWdd(T0) of the temperature frequency correction word TCW(T0) of the initial temperature T0. The difference of the temperature frequency correction word is the difference value between the temperature frequency correction words of two adjacent temperature points. The second order difference of the temperature frequency correction word is the difference value between the differences of the temperature frequency correction words of two adjacent temperature points. The fixed step size value is the absolute value of the difference between the second order differences of the temperature frequency correction words of two adjacent temperature points. So, the fixed step size value can be also referred as the fixed second order difference step size value and denoted as TCWdds.

The method for successively tracking and locking the temperature frequency correction word TCW(T) of the current temperature T in the second preferred embodiment is substantially identical with the method shown in FIG. 5 except for operations of 509 and 517.

The operation 509 is modified as:

$$TCW(Tx+S)=TCW(Tx)+TCWd(Tx);$$

$$TCWd(Tx+S)=TCWd(Tx)+TCWdd(Tx);$$

$$TCWdd(Tx+S)=TCWdd(Tx)+SB(Tx)*TCWdds.$$

The operation 517 is modified as:

$$TCWdd(Tx-S)=TCWdd(Tx)-SB(Tx-S)*TCWdds;$$

$$TCWd(Tx-S)=TCWd(Tx)-TCWdd(Tx-S);$$

$$TCW(Tx-S)=TCW(Tx)-TCWd(Tx-S).$$

Likewisely, the determining operations of the data TCW (T0), TCWd(T0), TCWdd(T0), TCWdds and the successive sign bit sequence in the second preferred embodiment may be made a little changes relative to the determining operations shown in FIGS. 7 and 8. However, the basic ideas are identical, the specific changes is omitted here for claricity.

In a third preferred embodiment, the memory only stores TCW(T0), the fixed step size value and the successive sign bit sequence. The fixed step size value is the absolute value of the difference between the temperature frequency correction words of two adjacent temperature points. The fixed step size value can be denoted as TCWs.

The method for successively tracking and locking the temperature frequency correction word TCW(T) of the current temperature T in the third preferred embodiment is substantially identical with the method shown in FIG. 5 except for operations of 509 and 517.

The operation 509 is modified as:

$$TCW(Tx+S)=TCW(Tx)+SB(Tx)*TCWs.$$

The operation 517 is modified as:

$$TCW(Tx-S)=TCW(Tx)-SB(Tx-S)*TCWs.$$

Likewisely, the determining operations of the data TCW (T0), TCWs and the successive sign bit sequence in the third embodiment may also be made a little changes relative to the determining operations shown in FIGS. 7 and 8. However, the basic ideas are identical, the specific changes is omitted here for clarity.

In one embodiment, it has plural groups of initial data for different temperature covering ranges. For example, for the temperature ranges of 0° C.-20° C. shown in FIG. 6, a first initial temperature T01 such as 0° C. is determined, a first group of initial data comprising TCW(T01), TCWd(T01), TCWds1 and the successive sign bit sequence are determined and stored in the memory 156; for the temperature ranges of −30° C.-0° C. shown in FIG. 6, a second initial temperature T02 such as −30° C. is determined, a second group of initial comprising TCW(T02), TCWd(T02), TCWds2 and the successive sign bit sequence are determined and stored in the memory 156; for the temperature ranges of 20° C.-80° C. shown in FIG. 6, a third initial temperature T03 such as 20° C. is determined, a third group of initial comprising TCW(T03), TCWd(T03), TCWds3 and the successive sign bit sequence are determined and stored in the memory 156. As a result, the compensation result may be more accurate to compensate the frequency drift of a reference signal with obvious frequency jumps shown like FIG. 6.

One of the features, objectives and advantages in the present invention is to successively track the current temperature T via decreasing or increasing the internal temperature Tx by the temperature interval S, compute the temperature frequency correction word of the internal temperature Tx by using corresponding sign bit and the initial data such as pre-stored in the memory until the internal temperature Tx is locked into the locked range of the current temperature T. By the successive approximation solution of the present invention, the memory for the initial data is minimized while the number of the compensated temperature points is maximized. Furthermore, the high compensation accuracy can be achieved.

Theoretically, the successive approximation solution of the present invention is not limited in use of obtaining the temperature frequency correction word. In fact, the successive approximation solution can be used to replace all conventional look-up table solution in any application fields. According to another aspect of the present invention, the successive approximation method and apparatus are provided for obtaining corresponding look-up word V according to a current look-up point P. Referring to FIGS. 1 and 2, the successive approximation apparatus for obtaining a look-up word V, corresponding to the TCW successive approximation circuit 150, comprises a look-up point comparator, a look-up point approximation circuit, a look-up word locked circuit and a memory, wherein the look-up point P corresponds to the compensated temperature point T, and the look-up word V corresponds to the temperature frequency correction word TCW.

Substituting the look-up point P for the compensated temperature point T, and substituting the look-up word V for the temperature frequency correction word TCW, the successive approximation solution for obtaining corresponding look-up word V can be achieved according to the successive approximation solution for obtaining the temperature frequency correction word TCW described above. Next, some specific substituting operations are described hereafter as examples.

In the first preferred embodiment, the memory further stores a difference Vd(P0) of the look-up value V(P0) of the initial look-up point P0 besides V(P0), the fixed step size value and the successive sign bit sequence. The difference of the look-up value is the difference value between the look-up values of two adjacent look-up points. The fixed step size value is the absolute value of the difference between the differences of the look-up values of two adjacent look-up points. So, the fixed step size value can be also referred as the fixed difference step size value and denoted as Vds.

At 507, one sign bit SB(Px) of the internal look-up point Px is read out from the successive sign bit sequence and assigned to the fixed difference step size value Vds to get the actual difference step size of the internal look-up point Px.

At 509, the look-up value V(Px+S) and the difference Vd(Px+S) of the internal look-up point Px+S are computed depending on the look-up value V(Px), the difference Vd(Px) and the actual step size of the internal look-up point Px, wherein:

$$V(Px+S)=V(Px)+Vd(Px);$$

$$Vd(Px+S)=Vd(Px)+SB(Px)*Vds.$$

where S is the look-up point interval herein.

The present invention has been described in sufficient detail with a certain degree of particularity. It is understood to those skilled in the art that the present disclosure of embodiments has been made by way of examples only and that numerous changes in the arrangement and combination of parts may be resorted without departing from the spirit and scope of the invention as claimed. Accordingly, the scope of the present invention is defined by the appended claims rather than the forgoing description of embodiments.

We claim:

1. An apparatus for compensating a frequency drift in a reference frequency signal, the apparatus comprising:
    a successive approximation circuit configured to produce a temperature frequency correction word in accordance with a frequency compensation value in view of a current temperature, wherein the temperature frequency correction word is determined in real time without using a look-up-table; and
    a frequency locked circuit, receiving the reference frequency signal from an external oscillating source and a corrected frequency control word, configured to generate a substantially temperature compensated frequency output in reference to the temperature frequency correction word from the successive approximation circuit,
    wherein each of the temperature frequency correction word and the corrected frequency control word is data represented in a sequence of bits.

2. The apparatus as recited in claim 1, wherein the successive approximation circuit includes a memory space for storing the temperature frequency correction word for an initial temperature, a fixed step size value expressed in bits, and a successive sign bit sequence including 1s and 0s, wherein the fixed step size value is positive or negative when a sign bit in the successive sign bit sequence is "1" or "0", or the fixed step size value is negative or positive when a sign bit in the successive sign bit sequence is "0" or "1".

3. The apparatus as recited in claim 2, wherein the successive sign bit sequence is a sequence including at least a sign bit of each fixed step size value.

4. The apparatus as recited in claim 2, wherein the temperature frequency correction word at each of compensated temperature points is accurately measured during manufacturing or testing by comparing an output frequency and an actually expected frequency.

5. The apparatus as recited in claim 4, wherein the temperature frequency correction value between any two of the compensated points is estimated by an interpolation logic.

6. The apparatus as recited in claim 2, wherein the successive approximation circuit further includes:
    a temperature comparator configured to compare a predetermined temperature with a current temperature to determine whether the current temperature enters into a locked range of the predetermined temperature; and
    a temperature approximation circuit configured to increase or decrease the current temperature by an temperature interval and output a new temperature to the temperature comparator, thus the current temperature is successively approximated to the predetermined temperature.

7. The apparatus as recited in claim 6, wherein the successive approximation circuit further includes a computing circuit configured to read one sign bit from the successive sign bit sequence, and assign a read sign bit to the fixed step size value to get an actual step size to reach the current temperature.

8. The apparatus as recited in claim 6, wherein the temperature comparator produces a comparative result for one of three different situations: the current temperature being inside a locked range of the predetermined temperature, the current temperature being outside the locked range of the predetermined temperature with the current temperature being lower than the predetermined temperature, and the current temperature being outside the locked range of the predetermined temperature with the current temperature being higher than the predetermined.

9. The apparatus as recited in claim 2, wherein the corrected frequency control word is generated from a frequency correction circuit operating on at least two inputs: the temperature frequency correction word from the successive approximation circuit, and the frequency control word determining, and wherein the corrected frequency control word is provided to produce the substantially temperature compensated frequency output from the reference frequency signal.

10. The apparatus as recited in claim 2, wherein there are a plurality of initial temperatures in an overall temperature range, the memory is configured to store one initial temperature frequency correction word and one fixed step size value for each of the initial temperatures.

11. The apparatus as recited in claim 2, wherein the temperature frequency correction word of the initial temperature, the fixed step size value and the successive sign bit sequence are determined by performing following operations:
    sampling a temperature versus frequency curve of the reference frequency signal at the predefined temperature interval;
    calculating an ideal temperature frequency correction word of each sampling temperature;
    selecting one sampled temperature as the initial temperature such that the ideal temperature frequency correction word of the selected sampling temperature is regarded as the temperature frequency correction word of the initial temperature; and
    calculating the fixed step size value and each sign bit of the fixed step size value in the successive sign bit sequence according to ideal temperature frequency correction words of the sampled temperatures.

12. The apparatus as recited in claim 2, wherein a maximal absolute value of second order differences of an ideal temperature frequency correction word is determined as the fixed step size value.

* * * * *